United States Patent [19]
Drake et al.

[11] Patent Number: 5,870,822
[45] Date of Patent: Feb. 16, 1999

[54] FLIP CHIP ATTACHMENT

[75] Inventors: Jeremy John Edward Drake, Stoke-On-Trent; Michael Williem Hendriksen, St Helens, both of England

[73] Assignee: International Computers Limited, London, United Kingdom

[21] Appl. No.: 854,626

[22] Filed: May 12, 1997

[30] Foreign Application Priority Data

May 22, 1996 [GB] United Kingdom ............... 9610689

[51] Int. Cl.⁶ .................................................. H05K 3/34
[52] U.S. Cl. ........................... 29/840; 29/830; 29/832; 29/846; 29/852; 174/265; 216/18; 228/188.22; 228/254
[58] Field of Search ............................. 29/830, 832, 834, 29/840, 846, 847, 852; 228/188.22, 254; 427/96, 123; 216/65, 18, 20; 174/260, 261, 265

[56] References Cited

U.S. PATENT DOCUMENTS

| | | | |
|---|---|---|---|
| 4,179,802 | 12/1979 | Joshi et al. | 29/830 |
| 4,566,186 | 1/1986 | Bauer et al. | 29/830 X |
| 4,642,160 | 2/1987 | Burgess | 29/852 X |
| 4,946,563 | 8/1990 | Yeatts | 29/840 X |
| 5,072,075 | 12/1991 | Lee et al. | 29/830 X |
| 5,077,598 | 12/1991 | Bartelink | 257/723 |
| 5,388,327 | 2/1995 | Trabucco | 29/830 |
| 5,393,696 | 2/1995 | Koh et al. | 437/183 |
| 5,396,702 | 3/1995 | Dautartas | 29/840 |
| 5,449,427 | 9/1995 | Wojnarowski et al. | 29/846 X |
| 5,457,344 | 10/1995 | Bartelink | 257/737 |
| 5,457,881 | 10/1995 | Schmidt | 29/830 X |
| 5,527,741 | 6/1996 | Cole et al. | 29/832 X |
| 5,537,740 | 7/1996 | Shirai et al. | 29/852 |
| 5,685,070 | 11/1997 | Alpaugh et al. | 29/840 |
| 5,710,063 | 1/1998 | Forehand et al. | 29/831 X |

FOREIGN PATENT DOCUMENTS

| | | |
|---|---|---|
| 0 405 865 A2 | 1/1991 | European Pat. Off. . |
| 7-142488 | of 0000 | Japan . |

*Primary Examiner*—Peter Vo
*Assistant Examiner*—Rick Kiltae Chang
*Attorney, Agent, or Firm*—Lee, Mann, Smith, McWilliams, Sweeney & Ohlson

[57] ABSTRACT

A flip chip is soldered to an array of flexible pillars of compliant dielectric material on a circuit board. Each pillar has an electrically conductive core electrically coupled to the circuit board. The pillars absorb movement due to differences in the coefficient of thermal expansion of the chip and board, and hence reduce the possibility of fatigue failure of the solder joint. The pillars are manufactured by forming a layer of compliant dielectric material on the circuit board, forming blind holes in the layer, filling the holes with electrically conductive material overlapping the edges of the holes, and then laser ablating to remove the compliant dielectric material except where protected by the electrically conductive material.

18 Claims, 2 Drawing Sheets

FLIP CHIP ATTACHMENT

BACKGROUND TO THE INVENTION

This invention relates to the direct attachment of flip chips to printed circuit boards (PCBs).

One problem with direct attachment of a flip chip to a PCB is the difference in coefficient of thermal expansion between the chip (made of silicon) and the PCB (made of organic material such as reinforced epoxy resin). This produces stresses on the solder joint, which can result in failure of the joint through fatigue.

One known way of alleviating this problem is to fill the gap between the chip and the PCB with epoxy material. The material is applied in liquid form and drawn into the gap by capillary action. The material takes stresses away from the solder, and has been found to increase the fatigue life of the joint by a factor of ten. However, a problem with this is that the larger the chip the longer the time needed to draw the epoxy material into the gap. Possibly several passes are required to fill the gap completely, which causes problems with manufacturing. Another problem is that, after the gap is filled, removal and replacement of a defective chip is very difficult.

The object of the present invention is to provide an alternative technique for flip chip attachment which avoids these problems.

SUMMARY OF THE INVENTION

According to the invention there is provided a method of mounting a flip chip on a circuit board, the method comprising the steps:
(a) forming a layer of compliant dielectric material on the circuit board, covering a plurality of electrically conductive pads on the circuit board;
(b) forming blind holes in said layer, extending from the surface of the layer down to said electrically conductive pads;
(c) filling said blind holes with electrically conductive material;
(d) removing said compliant dielectric material to leave a plurality of flexible pillars, each pillar comprising an electrically conductive core surrounded by a sheath of said compliant material; and
(e) mounting a flip chip on said flexible pillars, by attaching electrical terminals on the flip chip to said flexible pillars.

DESCRIPTION OF AN EMBODIMENT OF THE INVENTION

One embodiment of the invention will now be described by way of example with reference to the accompanying drawings.

Figure 1:
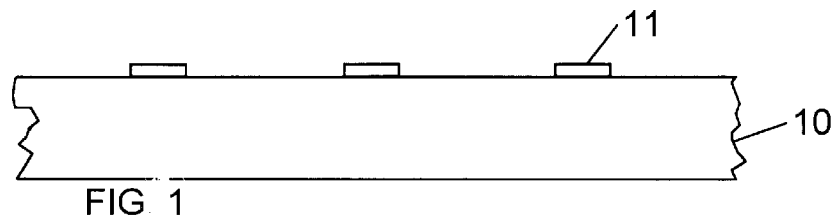
FIGS. 1–9 illustrate successive steps in forming a number of flexible pillars on a PCB, for attachment of a flip chip.

FIG. 1 shows a PCB 10, having an array of electrically conductive pads 11. The PCB contains internal electrically conductive tracks (not shown) connected to the pads 11.

Figure 2:
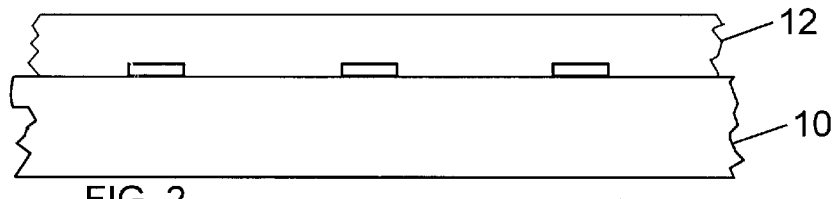

Referring to FIG. 2, a layer 12 of compliant dielectric material (e.g. an epoxy) is applied to the surface of the PCB, covering the electrically conductive pads 11. The material is applied in liquid or dry film form, and then cured. The thickness of this layer corresponds to the required pillar height; in this example, the thickness of the layer is 50 microns.

Figure 3:
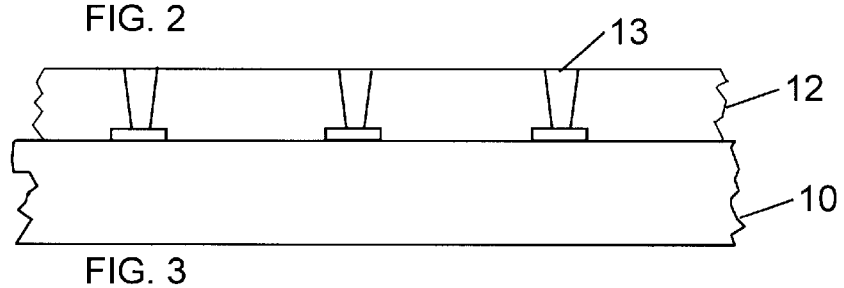

Referring to FIG. 3, the next step is to form blind holes 13 in the dielectric layer 12, leading down to each pad 11. Conveniently, the holes are formed by laser ablation.

Figure 4:
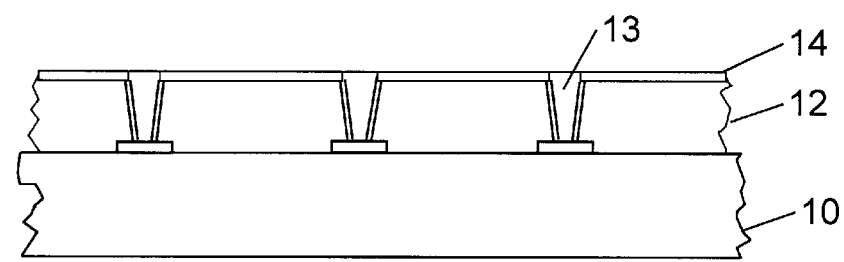

Referring to FIG. 4, the surface of the dielectric layer 12 is then coated with a layer of copper 14. This may be achieved by first depositing a thin layer by electroless plating, and then electrolytically depositing a thicker layer on top of the electroless layer. The copper layer 14 covers the surface of the dielectric layer, including the internal surfaces of the holes.

Figure 5:
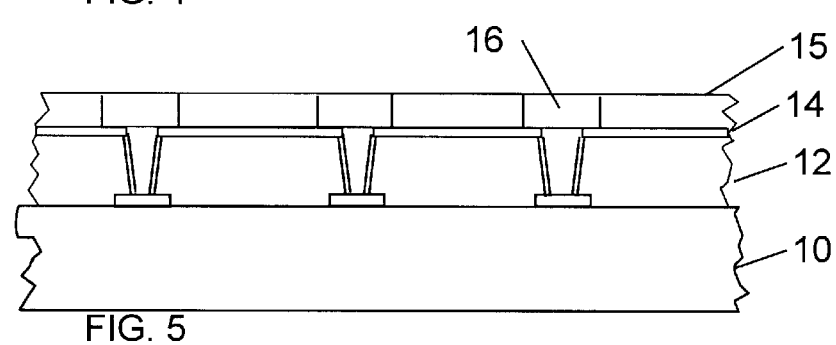

Referring to FIG. 5, a layer 15 of photosensitive masking material is then deposited on top of the copper layer. Apertures 16 are formed in the masking layer 15, by conventional photographic methods, so as to expose the holes 13 and a annular area around each hole.

Figure 6:
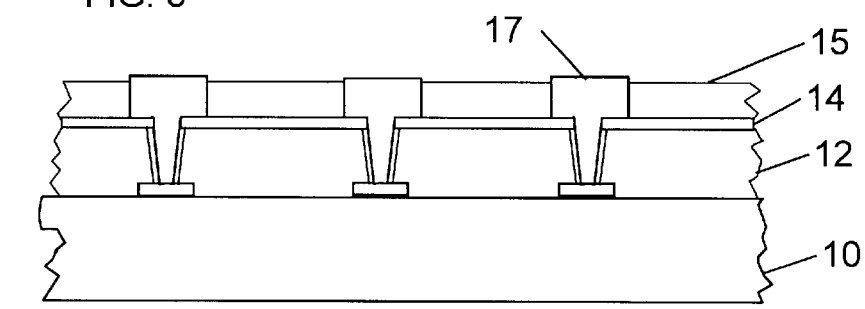

Referring to FIG. 6, the next step is to electroplate the copper layer 14 with a tin-lead alloy 17. The tin-lead fills the holes 13 and also extends laterally to cover annular areas around each hole, but does not cover the portions protected by the masking layer 15.

Figure 7:
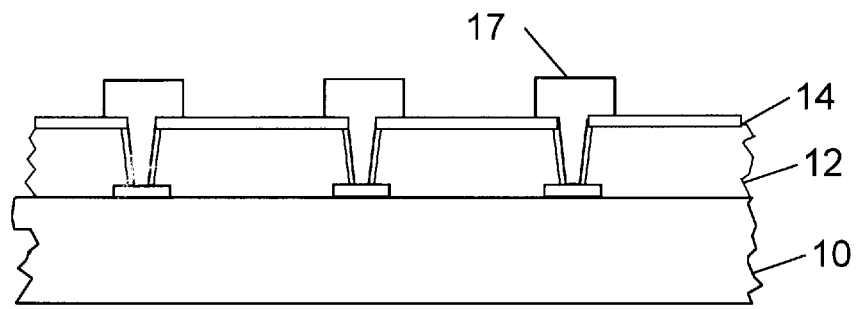

Referring to FIG. 7, the masking material 15 is then stripped off, for example using a conventional liquid chemical.

Figure 8:
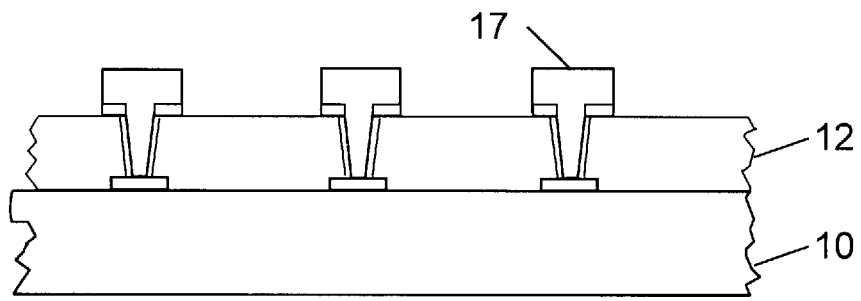

Referring to FIG. 8, the exposed portions of the copper layer 14 are then etched away. Parts of the copper layer protected by the tin-lead 17 are not removed.

Figure 9:
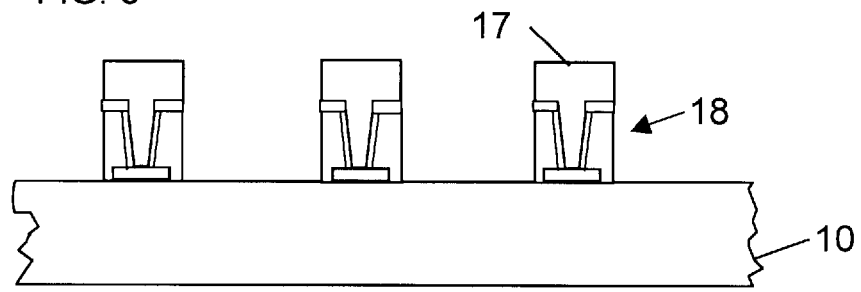

Referring to FIG. 9, laser ablation is then used to remove the parts of the dielectric layer 12 not covered by the tin-lead 17: the tin-lead acts as a mask for the laser ablation step. This leaves a number of pillars 18. Each pillar comprises an electrically conductive tin-lead core surrounded by a sheath of the compliant, flexible dielectric material, and is topped with a tin-lead pad 17.

Figure 10:
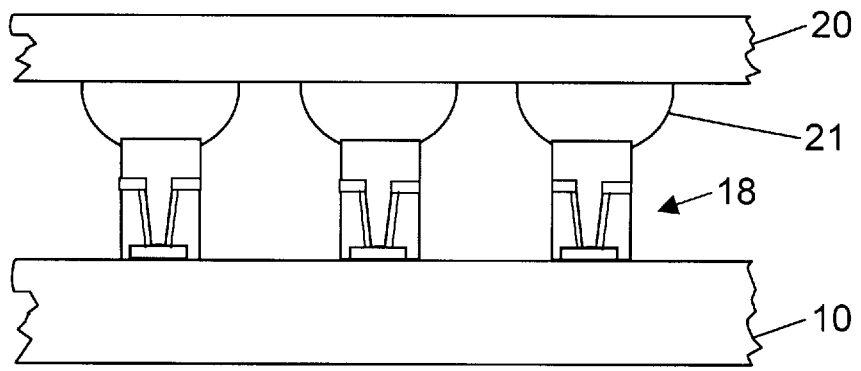
FIG. 10 shows the PCB with a flip chip attached to the flexible pillars.

Referring to FIG. 10, this shows a flip chip 20 mounted on the PCB. The flip chip has an array of solder bumps 21 for forming electrical connections to the PCB. The flip chip is mounted on the PCB by soldering the solder bumps 21 to the tin-lead pads 17 on the tops of the pillars 18.

Because the pillars 18 are formed of compliant, flexible material, they can bend sideways, and hence can absorb differential movement between the chip and the PCB. Typically, the amount of movement to be absorbed might be in the order of 10 microns.

Some Possible Modifications

It will be appreciated that many modifications may be made to the system described above without departing from the scope of the present invention. For example, different materials may be used to form the conductive cores or the compliant dielectric portions of the pillars.

We claim:
1. A method of mounting a flip chip on a circuit board, the method comprising the steps:
   (a) forming a layer of compliant dielectric material on the circuit board, covering a plurality of electrically conductive pads on the circuit board;
   (b) forming blind holes through said layer of compliant dielectric material from a surface of said layer to said electrically conductive pads;
   (c) filling said blind holes with electrically conductive material;
   (d) specifically removing said layer of compliant dielectric material to leave a plurality of flexible pillars, each of said pillars comprising an electrically conductive core surrounded by a sheath of said layer of compliant dielectric material; and (e) mounting a flip chip on said flexible pillars, by attaching electrical terminals on the flip chip to said flexible pillars.

2. The method according to claim 1 wherein the step of specifically removing said layer of compliant dielectric material comprises laser ablation.

3. The method according to claim 2 wherein the step of filling said blind holes with electrically conductive material includes extending said electrically conductive material laterally over a region of said compliant dielectric material surrounding each of said blind holes, and wherein said laser ablation removes said compliant dielectric material except where protected by said electrically conductive material.

4. The method according to claim 3 wherein the step of filling said blind holes with electrically conductive material comprises the steps:

(a) applying a first layer of conductive material to said compliant dielectric material, including internal surfaces of said blind holes;

(b) applying a mask to said first layer, said mask having apertures exposing each of said blind holes and an annular area around each of said blind holes;

(c) depositing a second layer of conductive material, thicker than said first layer of conductive material, on to regions of said first layer of conductive material that are exposed through said mask;

(d) removing said mask; and (e) specifically removing said first layer of conductive material except where protected by said second layer of conductive material.

5. The method according to claim 4 wherein said first layer of conductive material is formed of copper.

6. The method according to claim 5 wherein said second layer of conductive material is formed of a tin-lead alloy.

7. The method according to claim 6 wherein said second layer is deposited on said first layer by electroplating.

8. The method according to claim 7 wherein said step of removing said first layer comprises etching.

9. The method according to claim 1 wherein said compliant dielectric material comprises an epoxy material.

10. A method of manufacturing a substrate for mounting a flip chip, the method comprising:

(a) providing a circuit board having an array of electrically conductive pads;

(b) forming a layer of compliant dielectric material on the circuit board, covering said electrically conductive pads;

(c) forming blind holes through said layer of compliant dielectric material, from a surface of said layer to said electrically conductive pads;

(c) filling said blind holes with electrically conductive material; and (d) specifically removing said layer of compliant dielectric material to leave a plurality of flexible pillars, each of said pillars comprising an electrically conductive core surrounded by a sheath of said layer of compliant dielectric material.

11. The method according to claim 10 wherein the step of specifically removing said layer of compliant dielectric material comprises laser ablation.

12. The method according to claim 11 wherein the step of filling said blind holes with electrically conductive material includes extending said electrically conductive material laterally over a region of said compliant dielectric material surrounding each of said blind holes, and wherein said laser ablation removes said compliant dielectric material except where protected by said electrically conductive material.

13. The method according to claim 12 wherein the step of filling said blind holes with electrically conductive material comprises the steps:

(a) applying a first layer of conductive material to said compliant dielectric material, including internal surfaces of said blind holes;

(b) applying a mask to said first layer, said mask having apertures exposing each of said blind holes and an annular area around each of said blind holes;

(c) depositing a second layer of conductive material, thicker than said first layer of conductive material, on to regions of said first layer of conductive material that are exposed through said mask;

(d) removing said mask; and (e) specifically removing said first layer of conductive material except where protected by said second layer of conductive material.

14. A method according to claim 13 wherein said first layer of conductive material is formed of copper.

15. A method according to claim 14 wherein said second layer of conductive material is formed of a tin-lead alloy.

16. A method according to claim 15 wherein said second layer is deposited on said first layer by electroplating.

17. A method according to claim 16 wherein said step of removing said first layer comprises etching.

18. A method according to claim 10 wherein said compliant dielectric material comprises an epoxy material.

* * * * *